United States Patent [19]

Johnson et al.

[11] Patent Number: 4,529,769
[45] Date of Patent: Jul. 16, 1985

[54] POLY(ARYLENE SULFIDE) COMPOSITION, MOLDING METHOD AND ARTICLE OF MANUFACTURE

[75] Inventors: Timothy W. Johnson; Francis X. Mueller, Jr., both of Bartlesville, Okla.

[73] Assignee: Phillips Petroleum Company, Bartlesville, Okla.

[21] Appl. No.: 558,677

[22] Filed: Dec. 6, 1983

[51] Int. Cl.$^3$ ............................................. C08K 3/22
[52] U.S. Cl. ................................. 524/425; 524/407; 524/413; 524/414; 524/419
[58] Field of Search .............. 524/424, 413, 407, 414, 524/451; 428/419

[56] References Cited

U.S. PATENT DOCUMENTS

| | | | |
|---|---|---|---|
| 3,539,306 | 4/1970 | Kumura | 23/315 |
| 3,562,199 | 2/1971 | Hill | 260/37 |
| 4,017,450 | 4/1977 | Bailey | 260/37 R |
| 4,064,084 | 12/1977 | Blackwell | 428/419 |
| 4,183,600 | 1/1980 | Schroeder | 339/218 R |
| 4,212,922 | 7/1980 | Tieszen | 528/419 |
| 4,284,762 | 8/1981 | Miyata et al. | 524/451 |
| 4,299,759 | 11/1981 | Miyata et al. | 524/321 |
| 4,353,817 | 10/1982 | Nakae et al. | 524/398 |
| 4,379,882 | 4/1983 | Miyata | 524/436 |
| 4,427,816 | 1/1984 | Aoki et al. | 524/320 |

OTHER PUBLICATIONS

DHT-4A Data Sheets, Kyowa Chem. Industry Co. Chem. Ab. 99:62804t.

Primary Examiner—Lewis T. Jacobs
Attorney, Agent, or Firm—French & Doescher

[57] ABSTRACT

A composition is provided containing a poly(arylene sulfide) and a hydrotalcite. The composition can further contain glass fibers and is suitable as a molding composition. The hydrotalcite-containing poly(arylene sulfide) provides a molding composition which offers the combination of mold corrosion inhibition, hydrolytic stability and insulation resistance compared with prior molding compositions. Also provided is an article of manufacture comprising a hydrotalcite-containing poly(arylene sulfide) molded part in contact with a liquid electrolyte. The use of hydrotalcite-containing resin reduces the effect of corrosive ionic species extractable from the poly(arylene sulfide) by the electrolyte. Such an article of manufacture would include, for example, a capacitor having a liquid electrolyte and a poly(arylene sulfide) cover.

24 Claims, No Drawings

POLY(ARYLENE SULFIDE) COMPOSITION, MOLDING METHOD AND ARTICLE OF MANUFACTURE

BACKGROUND OF THE INVENTION

This invention relates to a poly(arylene sulfide) composition, to a molding method and to an electronic component. In one embodiment, the invention relates to a composition and method for improving the hydrolytic stability of a poly(arylene sulfide) molded article. In another aspect, the invention relates to an electronic component in which a poly(arylene sulfide) molded part is in contact with a liquid electrolyte.

Poly(arylene sulfide) resin is a chemical-resistant, high-temperature engineering thermoplastic which has many industrial applications, including injection molded parts and electronic components. During injection molding of certain poly(arylene sulfide) resins, corrosion of the metal parts of the mold can occur. Such corrosion of metal molds can be very costly, and attempts have been made to modify the poly(arylene sulfide) molding composition to reduce the tendency of such poly(arylene sulfide) compositions to corrode the metal surfaces of the molding equipment. One solution to the mold corrosion problem is given in U.S. Pat. No. 4,017,450, in which various chemical additives are disclosed as mold corrosion-inhibiting additives for poly(arylene sulfide) molding compositions.

It has been found, however, that such additives, while they are effective for reducing the corrosiveness of the poly(arylene sulfide) molding compositions, can sometimes bring about a reduction in the insulating ability and strength of the molded part in environments marked by high humidity and temperature. It would be desirable to produce a poly(arylene sulfide) molding composition which exhibited low mold corrosiveness, good insulating properties and retention of strength in moist environments.

In a different application, it has been found in electronic components that metal electrical leads are subject to corrosion when the electronic component includes a poly(arylene sulfide) part in contact with a liquid electrolyte. This is often seen in electrolytic capacitors having a liquid electrolyte in contact with molded poly(arylene sulfide) resin, and a similar problem is encountered in integrated circuits in moist environments. These problems are most notable when the leads are electrically biased. It would be desirable to reduce this corrosion in electronic components having poly(arylene sulfide) in contact with moisture or a liquid electrolyte.

It is therefore an object of the invention to provide a poly(arylene sulfide) molding composition which has a reduced tendency to corrode molds and acceptable electrical and mechanical properties in moist environments. It is a further object to provide electronic components comprising poly(arylene sulfide) parts in contact with a liquid electrolyte. It is a further object to provide a method of reducing corrosion of metal molding equipment.

SUMMARY OF THE INVENTION

According to one aspect of the invention, a composition comprising a poly(arylene sulfide) and a hydrotalcite is provided. The hydrotalcite preferably makes up about 0.01 to about 10 weight percent of the composition. The composition can further comprise glass fibers and other components depending upon end application.

According to a second aspect of the invention, an electronic component is provided comprising a hydrotalcite-containing poly(arylene sulfide) part in contact with a liquid electrolyte. For example, an electrolytic capacitor is provided in which a hydrotalcite-containing poly(arylene sulfide) molded part is in contact with a liquid electrolyte such as dimethylformamide (DMF). Such a device has a reduced tendency to exhibit corrosion of metal electrodes.

Also provided is a method for reducing corrosion of metal molding equipment employed in molding poly(arylene sulfide) compositions.

DETAILED DESCRIPTION OF THE INVENTION

The poly(arylene sulfide) can be any polymeric material formed predominately of one or more aryl moieties having sulfide linkages. Suitable starting materials for the polymer are disclosed in U.S. Pat. Nos. 3,354,129 and 3,919,177, the disclosures of which are hereby incorporated by reference. Such polymers include those represented by the formula $(-R-S-)_n$ wherein R is a substituted or unsubstituted arylene radical and n is at least 50. The manufacture of poly(arylene sulfide)s is known in the art. A polyhalosubstituted aromatic compound is reacted with a sulfur source in a polar organic solvent. In a commercial form of this process, para-dichlorobenzene is reacted with sodium sulfide in N-methylpyrrolidone solvent. A process for producing high molecular weight, film-grade poly(arylene sulfide) is described in U.S. Pat. No. 3,919,177. According to the process described therein, p-dichlorobenzene is reacted with sodium sulfide in N-methylpyrrolidone solvent in the presence of an alkali metal carboxylate. The resulting polymer resin has a melt viscosity of 100 to 600,000 poise, preferably 300 to 100,000 poise at 300° C. and a shear rate of 200 $sec^{-1}$.

Suitable polyhalosubstituted aromatic compounds for producing poly(arylene sulfide) polymers and copolymers include 1,2-dichlorobenzene, 1,3-dichlorobenzene, 1,4-dichlorobenzene, 2,5-dichlorotoluene, 1,4-dibromobenzene, 2,5-dibromoaniline, 2,4,6-tribromoaniline, 1,3,5-trichlorobenzene, and like.

The preferred poly(arylene sulfide) in terms of its availability and properties is poly(phenylene sulfide), in which R in the above formula is predominately an unsubstituted phenylene radical. Poly(phenylene sulfide) is a thermoplastic polymer having a melting point of about 280° to 290° C. It is available in various forms as Ryton ® poly(phenylene sulfide), a product of Phillips Petroleum Company.

The poly(arylene sulfide) of the invention can be a copolymer of two or more aromatic monomers. Referring to the general $(-R-S-)_n$ formula above, the predominate R group in a copolymer will generally be phenylene with relatively minor amounts of, for example, aryl moieties

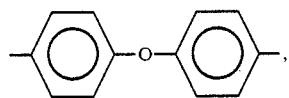

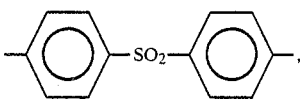

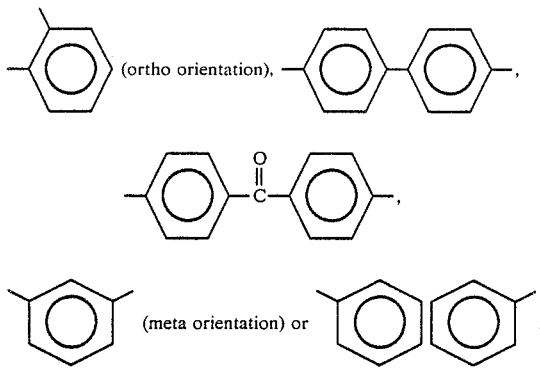

although these can also comprise the majority of the R groups in a poly(arylene sulfide) polymer. The preferred copolymers are those in which at least about 90 percent of the aromatic units are unsubstituted monoaromatic units. The linkages for the aromatic units can include, in addition to sulfides, other species such as

and —O—, for example.

The polymer may be blended, as is known in the art, with fillers, pigments, antioxidants and other additives as needed for final end use properties.

The composition or molded object formed from it may optionally be annealed by heating at an elevated temperature, generally in the range of about 100° C. to about 300° C., preferably about 125° C. to about 250° C., for a time of from about 30 minutes to 20 hours, preferably about 1 to about 3 hours.

The hydrotalcite component of the invention composition can be a natural or synthetic material which corresponds roughly to naturally-occurring minerals having chemical structures such as $Mg_6Al_2(OH)_{16}CO_3.4H_2O$ or $Al_2O_3.6MgO.CO_2.12H_2O$. Hydrotalcite-like compounds can be synthesized according to various processes, such as that of U.S. Pat. No. 3,539,306. Generally, synthetic hydrotalcites can be produced by co-precipitation of a solution of the cationic component with a solution of the anionic component. Hydrotalcite-like materials of the general formula $[Mg_{1-x}Al_x(OH)_2]^{x+}[A_{x/n}mH_2O]^{x-}$, wherein n is the charge on anion A, m is the number of moles of water of hydration, and x is less than 1, can be prepared. Although the magnesium/aluminum hydrates are the most common cationic species for the hydrotalcites, various metals can be substituted. For example, magnesium can be replaced by calcium, zinc, copper, manganese, lithium or nickel; and aluminum in the generic formula can be replaced by chromium (+3) or iron, for example. The anionic species can also vary, with carbonate or phosphate the most likely candidates. The most readily-available hydrotalcite compounds will be magnesium-aluminum hydroxy carbonate hydrates. The preferred hydrotalcite compound is magnesium aluminum hydroxy carbonate hydrate, which is available under the commercial name DHT-4A, which is characterized by the manufacturer as $Mg_{4.5}Al_2(OH)_{13}CO_3.3.5H_2O$.

The hydrotalcite compound will generally be present in the composition in an amount of from about 0.01 to about 10 weight percent, based on the weight of the composition. Preferably, the hydrotalcite will be present in the composition in an amount of from about 0.1 to about 5, most preferably about 1 to about 5 weight percent.

The composition can optionally contain glass fiber filler, generally present for injection molding applications in an amount of from about 20 to about 60 weight percent, based on the weight of the composition, preferably about 20 to about 40 weight percent. Generally glass fibers about ¼ to about 2 inches in length are incorporated.

The composition can further optionally contain an organosilane compound, preferably a trialkoxysilane such as 3-mercaptopropyltrimethoxysilane, 3-aminopropyltriethoxysilane, N-beta-(aminoethyl)-gamma-aminopropyltrimethoxysilane, gamma-glycidoxypropyltrimethoxysilane, methyltrimethoxysilane, tetrapropoxysilane, gamma-chloropropyltrimethoxysilane, and 2-(benzylchloro)ethyltrimethoxysilane, for example. Such an organosilane will generally be present in the composition in an amount of from about 0.005 to about 1 weight percent, based on the weight of the poly(arylene sulfide) resin present. Molding compositions containing both the hydrotalcite and the organosilane compound have been found to exhibit superior physical properties.

The poly(arylene sulfide) compositions of the invention can include various additives to enhance physical or chemical properties for specific end uses, such as fillers, pigments, stabilizers, softeners, extenders and other polymers.

In one embodiment of the invention, a molding composition will contain an intimate mixture of a poly(arylene sulfide) resin and about 0.01 to about 10 weight percent, based on the weight of the composition, of a hydrotalcite, glass fibers present in an amount of about 25 to about 50 weight percent, and optional components including calcium sulfate or other mineral filler present in an amount of about 20 to about 40 weight percent, high density (about 0.92 to about 0.95 g/cc) polyethylene, and a salt of a carboxylic acid such as zinc stearate, present in the composition in an amount of about 0.01 to about 3 weight percent. Such compositions, without the hydrotalcite, are commercially-available and are formulated particularly for molding applications.

The poly(arylene sulfide) in such molding compositions is preferably an oxygen-cured poly(phenylene sulfide) having a melt flow in the range of about 50 to about 1000 g/10 min.

For certain electrical applications, molded parts must exhibit chemical resistance, high temperature stability and good insulation resistance. The insulation resistance between two electrodes in contact with, or embedded in, a specimen is the ratio of the direct voltage applied to the electrodes to the current between them. The addition of hydrotalcite to a poly(arylene sulfide) glass-filled resin produces a material having acceptable electrical insulation resistance properties in addition to the excellent mold corrosion inhibiting properties and hydrolytic stability imparted by the hydrotalcite.

In the use of glass-filled poly(arylene sulfide) molded parts, a problem often encountered is the loss of strength of the molded object from contact with water, a problem believed to result from the presence of certain mold corrosion-inhibiting additives in the molding composition. It has been found that the incorporation of a hydrotalcite in the molding resin significantly improves the hydrolytic stability of the modified resin over the previous modified resin and reduces the loss of strength of the molded poly(arylene sulfide) after exposure to moisture.

According to one embodiment of the invention, an electronic component comprises a formed or molded part of poly(arylene sulfide) containing a hydrotalcite. The hydrotalcite will preferably be present in the mold composition and in the resulting molded part in an amount within the range of about 0.01 to about 10 weight percent, based on the weight of the composition. The electronic component exhibits greater stability in humid environments as a result of the incorporation of the hydrotalcite in the poly(arylene sulfide) resin making up the molded part.

The electronic component can further contain a liquid electrolyte. In electrolytic capacitors, for example, a poly(arylene sulfide) container or some portion thereof, such as a lid, is employed to enclose the active components including aluminum foil, aluminum tab stock, separators and a liquid electrolyte. The liquid electrolyte is usually an ionic material such as a boric acid salt and a solvent such as water, ethylene glycol, dimethylformamide or other polar liquid. The incorporation of a hydrotalcite in the lid resin suppresses the extraction of certain corrosive ions from the resin into the electrolyte, where the ions could otherwise contact corrodible metal parts. The invention therefore includes electronic components such as electrolytic capacitors in which a poly(arylene sulfide) part is in contact with a liquid electrolyte.

According to another embodiment, the composition is suitable for encapsulating electronic components. Suitable encapsulation compositions can be prepared using a poly(arylene sulfide) resin in an amount of from about 25 to about 45 weight percent; about 0.1 to about 10 weight percent of a hydrogenated copolymer of a conjugated diene and a monovinyl-substituted aromatic compound; from about 5 to about 50 weight percent of a reinforcement material such as silica, wollastonite or glass, for example; and from about 18 to about 60 weight percent of a filler material such as talc, silica, clay, alumina, calcium sulfate, calcium carbonate or mica, for example; generally less than about 1-2 weight percent of zinc oxide and/or a organosilane compound; and a hydrotalcite as defined herein in an amount of about 0.01 to about 10 weight percent, based on the weight of the composition. For such encapsulation applications, the melt flow of the poly(arylene sulfide) will generally be greater than about 200 g/10 min, and for some encapsulation applications will be greater than about 750 g/10 min.

EXAMPLE I

This example demonstrates the hydrolytic stability of a glass-filled poly(phenylene sulfide) (hereinafter PPS) composition containing a hydrotalcite additive and compares these results with a PPS composition containing $Li_2CO_3$. The test procedure was as follows: A mixture of 1762.5 grams of PPS (melt flow 140–220 grams/10 min measured in accordance with test method ASTM D1238 at 600° F. using a 5 kilogram weight), 1200 grams of fiber glass (OC 197 from Owens Corning), 7.5 grams of high density polyethylene (BX670 from Phillips Petroleum Co.) and 30 grams of $Mg_{4.5}Al_2(OH)_{13}CO_3.3.5H_2O$ (DHT-4A, a basic magnesium aluminum hydroxide carbonate hydrate from Kyowa Chemical Industry Co.) were dry blended and extruded through a Davis Standard extruder at 600° F., ground into a coarse powder and dried in a 350° F. oven for at least 3 hours. The dried material was then molded into tensile bars using an Arburg injection molding machine (barrel 608° F., mold 122° F.).

The procedure was repeated except the DHT-4A hydrotalcite was replaced with $Li_2CO_3$. Several bars from each run were then placed in a pressure cooker half-filled with water and aged at 120° C. at 100% relative humidity and 15 pounds per square inch pressure for 150 hours. The bars were removed, air-dried at ambient room temperature overnight and tested for tensile strength by to test method ASTM D638. The results listed in Table I show that a PPS composition containing the hydrotalcite-like material retained tensile strength after exposure to a high humidity, high temperature environment better than the comparison $Li_2CO_3$-containing specimens.

TABLE I

| Effect of Hydrotalcite on the Hydrolytic Stability of Glass-Filled PPS | | | | |
|---|---|---|---|---|
| | Tensile Strength, psi | | | |
| | 1 Wt. % $Li_2CO_3$ | | 1 Wt. % Hydrotalcite[a] | |
| | Test 1 | Test 2 | Test 1 | Test 2 |
| Before Aging | 18,300 | 20,600 | 16,700 | 18,700 |
| After Aging (150 Hrs. at 120° C. @ 100% RH @ 15 psi) | 12,800 | 8,500 | 15,800 | 15,200 |
| % Loss | 30 | 58 | 5 | 19 |

[a]$Mg_{4.5}Al_2(OH)_{13}CO_3.3.5H_2O$, DHT-4A from Kyowa Chem. Ind. Co., Ltd.

EXAMPLE II

This example illustrates that the use of a hydrotalcite imparts acceptable electrical insulation resistance to glass-filled PPS, and, when used in combination with an organosilane, provides excellent electrical insulation resistance. The control compositions in the tests contained 1 weight percent $Li_2CO_3$ additive. The invention compositions contained 1.5 weight percent of a hydrotalcite and 0.5 weight percent of an organosilane, except in the accelerated test, for which no organosilane was present and both the control and the invention composition contained 2 weight percent $Li_2CO_3$ or hydrotalcite additive. PPS compositions similar to those described in Example I were injection-molded into square plates, 2.5 inches × 2.5 inches × 0.0625 inch. Each plate contained 3 molded-in holes (0.1875 diameter) which centered in the plate 1.25 inches apart from each other. The plates were washed with detergent, rinsed with tap water, then distilled water and finally with isopropyl alcohol to remove any contaminants present. A stainless steel bolt was inserted in each hole and fastened with a bolt and washer. To each bolt was attached a tin-coated copper wire (no. 18). The plate and wires were then suspended over a container of water in a chamber which was equipped with a Teflon lid. The wires from the plate were attached to separate terminals in the lid and these terminals were connected to an electric source. The complete chamber was placed in an air circulating oven. The oven was heated to 70° C. and the electrical resistance was periodically measured between pairs of leads using a Gen Rad megohmmeter (Genrad Co., Model 1864). Readings were taken 1 minute after the voltage was applied to obtain steady state readings. The results are listed in Table II and show that over a 12-day span (304 hours) at 70° C. and 100 percent relative humidity (RH) the glass-filled PPS composition containing an organosilane and a hydrotalcite additive provided superior electrical insulation resistance compared with a composition containing $Li_2CO_3$. A second test was made under accelerated conditions (90° C. and 95 percent RH) in which both the control and inventive composition had 2 weight percent additive, $Li_2CO_3$ and hydrotalcite, respectively. The results show the inventive composition at least equivalent in electrical insulation resistance to the control under the test conditions.

containing the hydrotalcite material ($9.0 \times 10^9$ ohms after 400 hours). However, the data also show that the composition is less sensitive to additional hydrotalcite than to additional $Li_2CO_3$. For example, at the 2 weight percent additive level, the electrical insulation resistance of a PPS composition containing the hydrotalcite is about $1.5 \times 10^9$ ohms after 400 hours at 100 percent relative humidity and 70° C., whereas with $Li_2CO_3$ the electrical insulation resistance is significantly lower, $9.0 \times 10^7$ ohms after similar exposure.

This information can be applied in compounding the PPS composition. During compounding, particularly on a plant scale, close monitoring to obtain an exact amount of additive is less critical with the hydrotalcite than with $Li_2CO_3$. This is particularly important when the final PPS composition is to be used in applications requiring high electrical insulation resistance.

TABLE III

Effect of Additive Concentration on Electrical Insulation Resistance of Glass-Filled PPS Composition (Ryton R-4)

| Electrical Insulation Resistance (Ohms) After x Hours at 70° C. and 100% R.H | Wt. % Additive[a] | | | | |
|---|---|---|---|---|---|
| | $Li_2CO_3$ | | DHT-4A | | |
| | 1.0 | 2.0 | 1.0 | 1.5 | 2.0 |
| 70 Hours | $6.5 \times 10^{11}$ | $4.8 \times 10^9$ | $1.7 \times 10^{11}$ | $5.0 \times 10^{10}$ | $1.2 \times 10^{10}$ |
| 120 Hours | $3.2 \times 10^{11}$ | $1.5 \times 10^9$ | $8.0 \times 10^{10}$ | $2.5 \times 10^{10}$ | $5.7 \times 10^9$ |
| 240 Hours | $1.0 \times 10^{11}$ | $3.0 \times 10^8$ | $2.5 \times 10^{10}$ | $8.0 \times 10^9$ | $2.5 \times 10^9$ |
| 400 Hours | $2.5 \times 10^{10}$ | $9.0 \times 10^7$ | $9.0 \times 10^9$ | $3.8 \times 10^9$ | $1.6 \times 10^9$ |

[a]Based on total weight of composition.

TABLE II

Effect of Hydrotalcite on Electrical Insulation Resistance of Glass-Filled PPS

| | | Insulation Resistance, ohms | |
|---|---|---|---|
| | | Control[a] | Invention[b] |
| | Time, Hrs., at 70° C. and 100% RH | | |
| Standard Test: | 15 | $5.6 \times 10^{11}$ | $1.6 \times 10^{14}$ |
| | 66 | $3.3 \times 10^{10}$ | $8.7 \times 10^{13}$ |
| | 140 | $8.1 \times 10^9$ | $5.8 \times 10^{13}$ |
| | 304 | $1.5 \times 10^9$ | $3.5 \times 10^{13}$ |
| | Time, Hrs. at 90° C. and 95% RH | | |
| Accelerated Test: | 48 | $1.7 \times 10^{10}$[c] | $4.7 \times 10^{10}$[d] |

[a]Poly(phenylene sulfide) molding compound containing 58.9 wt. % PPS (air-cured to flow rate of 100-140 g/10 min), 40.0 wt. % fiberglass, 0.1 wt. % zinc stearate, 1.0 wt. % $Li_2CO_3$.
[b]Contains 1.5 wt. % DHT-4A ($Mg_{4.5}Al_2(OH)_{13}CO_3 \cdot 3.5H_2O$) and 0.5 wt. % organosilane (Y9194, Union Carbide)
[c]Contains 2 wt. % $Li_2CO_3$
[d]Contains 2 wt. % DHT-4A hydrotalcite

EXAMPLE III

This example illustrates the effect of concentration of a hydrotalcite material on the electrical insulation resistance of glass-filled PPS and compares this effect with PPS compositions containing $Li_2CO_3$. The samples were prepared in the same manner as described in Example II, except no organosilane was employed and various amounts of either the hydrotalcite or $Li_2CO_3$ were added to the glass-filled PPS composition.

The results, shown in Table III below, indicate that, at the normal 1 weight percent additive level, a standard glass-filled PPS composition containing $Li_2CO_3$ gives slightly better insulation resistance ($2.6 \times 10^{10}$ ohms after 400 hours) compared to a similar composition

EXAMPLE IV

This example illustrates the effectiveness of a magnesium aluminum hydroxide carbonate in providing a PPS composition which is more resistant to electrolyte liquid extraction of ionic species. The extraction of such ionic species into the electrolyte can result in an increase in corrosion of any metal parts present, but particularly the positively-charged terminal of an aluminum electrolytic capacitor. Such an electrolyte-resistant molded material is useful for applications such as capacitor containers and lids. The evaluation procedure was as follows: Molded disks, 2.25 inches diameter × 0.0618 inches thick, were prepared by injection molding a glass-filled PPS composition (Ryton ® poly(phenylene sulfide) molding compound from Phillips Petroleum Co.) using a 35-ton Arburg injection molding machine (6,000 psi 600° F. stock temperature, 275° F. mold temperature). Some of the molded disks were further annealed by heating in an air-circulating oven at 450° F. for 2 hours.

Both annealed and unannealed disks were washed with detergent and water, rinsed with water and placed in boiling distilled water for 30 minutes. The disks were air dried at ambient room temperature. Two disks separated by a thin Teflon spacer were put into a 250 milliliter Teflon bottle to which was also added 30 milliliters of high purity DMF (dimethylformamide). Several duplicate tests as well as a blank containing only DMF were prepared. The bottles were then placed in an 85° C. oven for 72 hours and were cooled slightly before the DMF was carefully decanted into clean polyethylene bottles.

Fifteen milliliters of this decanted extract were added to 135 milliliters of an electrolyte of high purity boric acid, water and ethylene glycol. The electrolyte-extract mixture was placed in a 250 milliliter Teflon beaker which had been previously fitted with two high-purity tab stock aluminum strips (20 inches long×0.170 inches thick×0.02 inches wide) as electrodes. The beaker with the electrodes, electrolyte and DMF extract was fitted with a cover, placed in an oven at 85° C., and connected externally to a 120-volt DC source. Current was initially high (50 to 100 milliamps) and decreased with time. In this test, the rate of decrease in the current is related to the concentration of chloride ions in the DMF extracted from a particular disk. DMF samples containing relatively low concentration of chloride ion have been shown to result in a rapid decrease of current with time and in low corrosion. Samples of DMF containing relatively high concentrations of extracted chloride ions have been shown to produce a relatively constant current for several minutes followed by a decrease in current and relatively high corrosion levels.

The data listed in Table III show that samples containing hydrotalcite resulted in significantly lower concentrations of corrosive ionic species in the electrolyte. This is evidenced by the lower current values after each sampling period (compare Runs 4 and 2, for example). The data also show that annealing the PPS composition is somewhat beneficial, particularly when hydrotalcite is present (compare Runs 5 or 6 with Run 4, for example). The data suggest that the presence of a hydrotalcite in a PPS glass-filled composition can increase the efficiency and life expectancy of a capacitor or like electronic device.

TABLE IV

Effect of Hydrotalcite on the Corrosivity of PPS Compositions

| Run No. | Composition | Current After Elapsed Time | | | |
|---|---|---|---|---|---|
| | | 4 mins | 20 mins | 40 mins | 60 mins |
| 1 | Blank (only DMF) | 53.4 | 6.7 | 3.1 | 1.45 |
| 2 | PPS Composition[a] | 105.1 | 103.8 | 21.1 | 15.7 |
| 3 | PPS Composition (Annealed)[b] | 80.3 | 85.1 | 34.9 | 15.9 |
| 4 | PPS Composition + 3% DHT-4A | 64.5 | 9.96 | 3.11 | 2.00 |
| 5 | PPS Composition + 3% DHT-4A (Annealed) | 55.3 | 6.9 | 2.5 | 1.66 |
| 6 | PPS Composition + 3% DHT-4A (Annealed) | 45.0 | 5.9 | 2.18 | 1.59 |

[a]PPS molding composition containing 38 weight % PPS (air-cured to flow rate of 750-950 g/10 min), 35% fiberglass; CaSO$_4$ filler; less than 1% HDPE; 1% LiCO$_3$
[b]Heated at 450° F. for 2 hours

We claim:

1. A composition comprising
   (a) a poly(arylene sulfide) and
   (b) a hydrotalcite.
2. The composition of claim 1 in which the hydrotalcite is an aluminum hydroxy carbonate.
3. The composition of claim 1 in which the hydrotalcite is a magnesium aluminum hydroxy carbonate.
4. The composition of claim 1 in which the hydrotalcite is present in the composition in an amount of from about 0.01 to about 10 weight percent, based on the weight of the composition.
5. The composition of claim 1 in which the poly(arylene sulfide) comprises aromatic units at least 90 mole percent of which are unsubstituted monoaromatic units joined by sulfide linkages.
6. The composition of claim 1 in which the poly(arylene sulfide) is poly(phenylene sulfide).
7. The composition of claim 1 in which the poly(arylene sulfide) has a melt flow in the range of about 20 to about 1000 g/10 min.
8. The composition of claim 4 which further comprises glass fiber present in the composition in an amount of from about 20 to about 60 weight percent, based on the weight of the composition.
9. The composition of claim 8 in which the poly(arylene sulfide) comprises aromatic units at least about 90 percent of which are unsubstituted monoaromatic units.
10. The composition of claim 9 in which the hydrotalcite is an aluminum hydroxy carbonate present in an amount of from about 0.10 to about 5 weight percent, based on the weight of the composition.
11. The composition of claim 9 in which the hydrotalcite is a magnesium aluminum hydroxy carbonate present in an amount of from about 0.10 to about 5 weight percent, based on the weight of the composition.
12. The composition of claim 9 in which the hydrotalcite is present in an amount of from about 0.50 to about 5 weight percent, based on the weight of the composition.
13. The composition of claim 9 in which the melt flow of the poly(arylene sulfide) is greater than about 750 g/10 min.
14. The composition of claim 13 which further comprises a filler selected from the group consisting of silica, wollostonite and glass.
15. The composition of claim 14 which further comprises zinc oxide.
16. The composition of claim 12 which further comprises an organosilane.
17. The composition of claim 16 in which the organosilane is a trialkoxysilane.
18. The composition of claim 12 in which the poly(arylene sulfide) is annealed.
19. The composition of claim 12 which further contains lithium carbonate.
20. A composition comprising an intimate mixture of
   (a) a poly(arylene sulfide) resin having a melt flow in the range of about 20 to about 1000;
   (b) about 0.5 to about 5 weight percent, based on the weight of the composition, of a magnesium aluminum hydroxide carbonate hydrate; and
   (c) about 20 to about 60 weight percent, based on the weight of the composition, of glass particles.
21. The composition of claim 19 which further comprises about 0.005 to about 1 weight percent, based on the weight of the poly(arylene sulfide), of an organosilane.
22. The composition of claim 19 which further comprises about 0.005 to about 1 weight percent, based on the weight of the poly(arylene sulfide), of zinc stearate.
23. The composition of claim 19 which further comprises about 0.1 to about 2 weight percent, based on the weight of the composition, of polyethylene having a density in the range of about 0.92 to about 0.95 g/cc.
24. The composition of claim 19 which further comprises from about 10 to about 40 weight percent, based on the weight of the composition, of a mineral filler.

* * * * *